(12) United States Patent
Doemer et al.

(10) Patent No.: US 8,350,227 B2
(45) Date of Patent: Jan. 8, 2013

(54) PROCESSING SYSTEM

(75) Inventors: Holger Doemer, Bopfingen (DE);
Stefan Martens, Woellstein (DE);
Walter Mack, Regensburg (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 13/336,155

(22) Filed: Dec. 23, 2011

(65) Prior Publication Data

US 2012/0091363 A1   Apr. 19, 2012

Related U.S. Application Data

(62) Division of application No. 12/542,926, filed on Aug. 18, 2009, now Pat. No. 8,115,180.

(30) Foreign Application Priority Data

Sep. 1, 2008   (DE) .......................... 10 2008 045 336

(51) Int. Cl.
*G21K 5/04* (2006.01)
(52) U.S. Cl. ................................ 250/442.11; 250/492.2
(58) Field of Classification Search ............. 250/442.11, 250/492.2, 492.1
See application file for complete search history.

(56) References Cited

U.S. PATENT DOCUMENTS

| | | | |
|---|---|---|---|
| 4,683,378 A | 7/1987 | Shimase et al. | |
| 5,055,696 A | 10/1991 | Haraichi et al. | |
| 5,905,266 A | 5/1999 | Larduinat et al. | |
| 6,023,068 A | 2/2000 | Takahashi | |
| 6,252,227 B1 | 6/2001 | Tseng et al. | |
| 6,855,938 B2 | 2/2005 | Preikszas et al. | |
| 7,045,791 B2 | 5/2006 | Benas-Sayag et al. | |
| 7,592,606 B2 * | 9/2009 | Ishiguro et al. .......... | 250/442.11 |
| 2005/0184251 A1 | 8/2005 | Oi et al. | |
| 2007/0111337 A1 | 5/2007 | Lowry | |
| 2007/0181828 A1 | 8/2007 | Yoon et al. | |

FOREIGN PATENT DOCUMENTS

| | | |
|---|---|---|
| JP | 58110042 | 6/1983 |
| JP | 58164135 | 9/1983 |
| JP | 62071158 | 4/1987 |
| JP | 05314941 | 11/1993 |
| WO | WO 2008/071303 | 6/2008 |

OTHER PUBLICATIONS

M. Krüger et al., "Laser-assisted decapsulation of plastic-encapsulated devices", Microelectronics Reliability 43 (2003), pp. 1827-1831.

(Continued)

*Primary Examiner* — Kiet T Nguyen
(74) *Attorney, Agent, or Firm* — Fish & Richardson P.C.

(57) ABSTRACT

A processing system includes a particle beam column for generating a particle beam directed to a first processing location; a laser system for generating a laser beam directed to a second processing location located at a distance from the first processing location; and a protector including an actuator and a plate connected to the actuator. The actuator is configured to move the plate between a first position in which it protects a component of the particle beam column from particles released from the object by the laser beam and a second position in which the component of the particle beam column is not protected from particles released from the object by the laser beam.

20 Claims, 5 Drawing Sheets

OTHER PUBLICATIONS

M. Halbwax et al., "Femtosecond laser micromachining of Integrated Circuits (ICs) for semiconductor defect analysis", Nanotech 2007, vol. 4, Chapter 3: Nanofabrication, pp. 438-441.

Z. Wei et al., "Development of Integrated FIB/SEM/Femtosecond Laser Tri-Beam Platform for Nanofabrication and Study of Nanostructures", 2005, http://www.ntu.edu.sg/nanocluster/events/nanosymposium/nanostructures/nanostructures_3.html.

C.-C. Tsao et al., "Coaxial Ion-Photon System", Microelectronics Reliability 41 (2001), pp. 1483-1488.

* cited by examiner

PROCESSING SYSTEM

CROSS-REFERENCE TO RELATED APPLICATION

This application is a divisional of U.S. application Ser. No. 12/542,926, filed Aug. 18, 2009, which claims priority under 35 U.S.C. §119 to German Patent Application DE 10 2008 045 336.6, filed Sep. 1, 2008, which is hereby incorporated by reference in its entirety.

FIELD

The disclosure relates to a processing system that can provide multiple energy beams for modifying and/or inspecting an object. The multiple energy beams may include a laser beam and a particle beam, such as an electron beam or an ion beam.

BACKGROUND

In the manufacture of miniaturized devices there exists a desire to modify an object by removing material from the object or by depositing material on the object.

Conventional systems used for modifying the object include a microscope for inspecting the object to monitor a process of the modification. An example of such conventional system is an electron microscope, in which an electron beam generated by the electron microscope is used for inspecting the object and also for activating a processing gas modifying the object. Another example of a conventional processing system includes an electron microscope to generate an electron beam and an ion beam column to generate an ion beam, where the electron beam and the ion beam can be directed to a same location of an object to be modified. Here, the ion beam can be used to modify the object, and the electron beam can be used to monitor the progress of such sample modification. A process gas can be supplied to the object to modify the object by an interaction with the process gas which is activated by the electron beam and/or the ion beam.

The conventional system using a particle beam, such as an electron beam or an ion beam, for modification of the object has an advantage in that the processing of the object can be performed with a relatively high accuracy. A disadvantage of such system is that the modification of the object can be slow and that a high processing time can be involved if a larger amounts of materials are to be removed from or deposited on the object.

Other known processing systems use a laser beam to remove material from an object. The removal rate, i.e. an amount of material removed per unit time, of the laser system is typically greater than that of a charged particle beam system. However, the accuracy of the modification of the object employing the laser system is typically much lower than the accuracy achievable with a particle beam system.

SUMMARY

In some embodiments, the disclosure provides a processing system that directs multiple energy beams toward an object to perform process the object (e.g., modify of the object, inspect the object).

In some embodiments, a processing system includes a particle beam column to generate a particle beam directed to a first processing location, and a laser system to generate a laser beam directed to a second processing location.

In certain embodiments, the particle beam column may include an electron beam column or an ion beam column, where the particle beam column can also be configured to operate as a particle beam microscope by including a secondary particle detector. The secondary particle detector may include an electron detector or an ion detector.

In some embodiments, the first processing location substantially coincides with the second processing location such that the object can be moved to the a location and can be processed at that location by both the laser beam and the particle beam without having to move the object for subsequent laser beam and particle beam processing.

In certain embodiments, the first processing location onto which the particle beam is directed is spaced apart from the second processing location onto which the laser beam is directed. The spaced apart processing locations can have an advantage if particles or other contaminations are generated by the laser beam, because the spacing can considerably reduce the deposition of such particles or other contaminants on components of the particle beam column as compared to situations where the first and second processing locations coincide.

In certain embodiments, the processing system includes a protector for protecting components of the particle beam column from particles or other contaminations produced during a processing with the laser beam. It is possible that a considerable amount of particles and other contaminations is released from the object during a laser processing and that such particles and contaminations can deposit on sensitive components of the particle beam system. Exemplary sensitive components of the particle beam system include electrodes and apertures of the particle beam column. Deposition on such components of the particle beam column may result in a deterioration of a performance of the particle beam column. For example, focussing of the particle beam may be deteriorated or imaging quality of the particle beam column may be deteriorated.

In some embodiments, the protector includes a plate and an actuator configured to move the plate back and forth between a first position in which the components of the particle beam system are protected from particles and contaminations released during the laser processing, and a second position particle in which the components of the particle beam system are not protected from the particles and contaminations released during the laser processing.

In certain embodiments, the protector is configured such that, in its first position, particles and other contaminations generated by the laser beam are prevented from hitting sensitive components of the particle beam column, while processing of the object using the particle beam is prevented by the plate. In the second position, the plate is in a retracted position in which processing or inspection of the object using the particle beam column is possible.

In some embodiments, the protector includes a door separating a first vacuum space in which the first processing location is located from second vacuum space in which the second processing location is located. The door may provide a shutter which closes an opening between the two vacuum spaces, where the shutter may allow, in its closed position, to maintain a pressure difference between the first and second vacuum spaces. For this purpose, each of the first and second vacuum spaces may include separate vacuum ports connection to vacuum pumps.

In embodiments where the first processing location is spaced apart from the second processing location, in general, the object has to be moved between the two processing locations to allow processing by both the laser beam and particle beam.

In some embodiments, the object is mounted on an object mount of a stage, where the stage includes at least one actuator to displace the object mount relative to the base. It is then possible to position the stage relative to the particle beam column and control the at least one actuator such that plural different locations of the object are located at the first processing location of the particle beam, without moving the base of the stage relative to the particle beam column. The base of the stage can be maintained at a fixed position on a suitable support, for example.

In certain embodiments, the processing system includes a transport device configured to move the stage back and forth between first and second predetermined positions. If the stage is positioned in the first position, the object mounted on the stage is located close to the first processing location to be processed by the particle beam, and if the stage is positioned in its second position, the object mounted on the stage is positioned close to the second processing location to be processed by the laser beam. In such configuration, the object can be moved back and forth between the first and second processing locations without removing the object from the object mount of the stage. According to exemplary embodiments, the transport device includes an actuator performing a translation of the stage from the first position to the second position. The transport device may include a carrier, such as a rail, to support the stage during translation between the first and second positions.

In some embodiments, in which the first and second processing locations are spaced apart from each other, the transport device includes a gripper configured to grip the object for movement between a first stage and a second stage, where the first stage mounts the object for processing by the particle beam, and the second stage is configured to mount the object for processing by the laser beam.

In some embodiments, the transport device for moving the object between the first and second processing locations includes an actuator for performing the movement. The actuator can include a rod traversing a wall of the vacuum vessel, where a sealing between the vacuum vessel and the rod is arranged such that a distance between the sealing and the first processing location is greater than a distance between the sealing and the second processing location.

BRIEF DESCRIPTION OF THE DRAWINGS

The foregoing as well as other advantageous features of the disclosure will be more apparent from the following detailed description, the claims, and the drawings in which:

DETAILED DESCRIPTION

Figure 1:
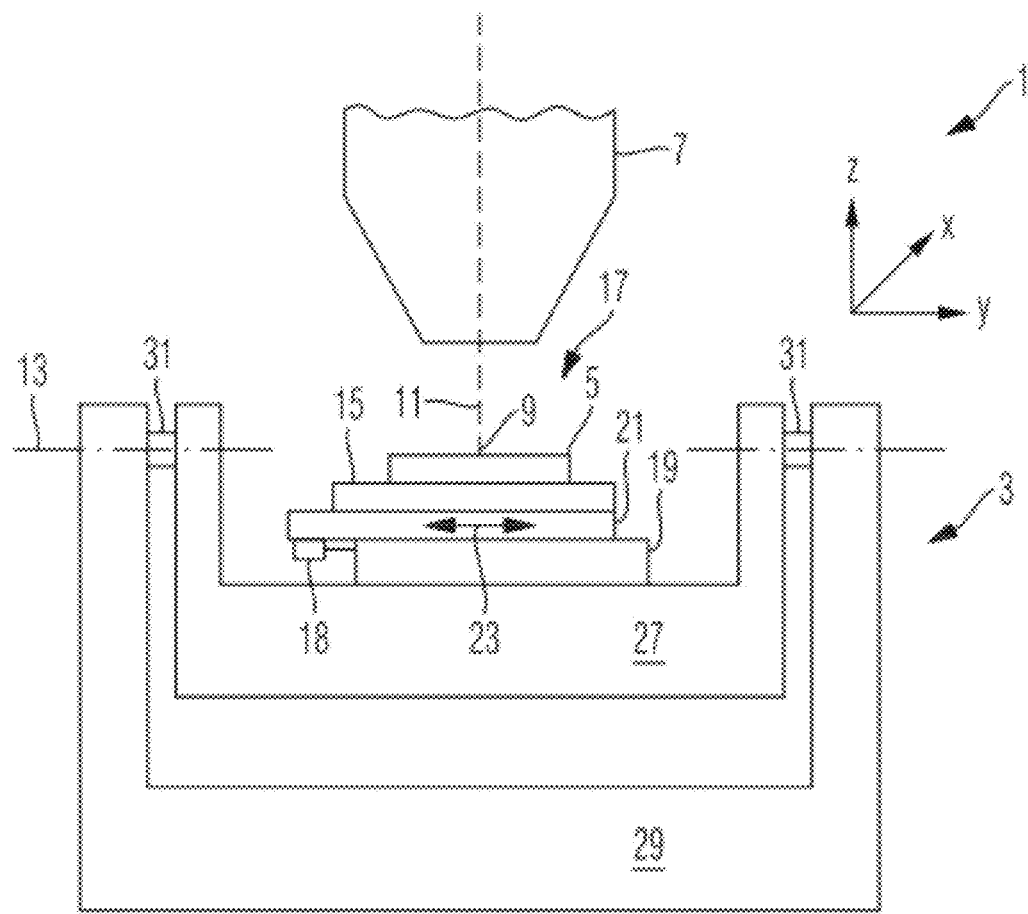
FIG. 1 is a schematic front view of a stage.

In the exemplary embodiments described below, components that are alike in function and structure are generally designated by alike reference numerals. Therefore, to understand the features of the individual components of a specific embodiment, the description of other embodiments and the summary may be referred to.

FIG. 1 is a schematic front view of a portion of a processing system 1 and illustrates a functionality of an object mount 3 which can be used in some embodiments of the processing system to mount an object 5 in front of a particle beam column 7. The particle beam column 7 is, in the illustrated example, an electron beam column for generating an electron beam 11 directed towards a processing location 9. The object mount 3 is configured to hold the object 5 such that a surface thereof is located at the processing location 9 and such that the object can be displaced in a x-direction, in a y-direction, a z-direction and such that the object can be tilted about an axis 13 oriented parallel to the y-direction, where the axis 13 is located close to the processing location 9 or intersects the processing location 9. The object 5 is mounted on and fixed to an object mount 15 of a stage 17. The object 5 can be abutted against an end stop on the object mount 15, and can be adhered to the object mount or fixed to the object mount 15 by a clamp and/or another suitable mechanism.

Figure 2:
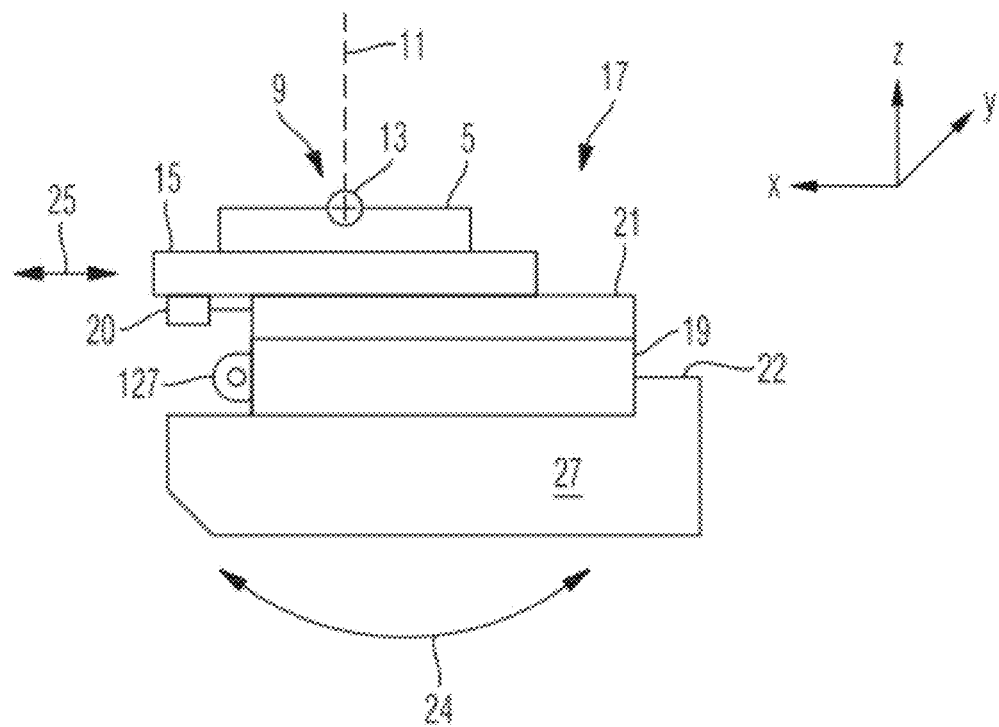
FIG. 2 is a schematic side view of the stage shown in FIG. 1.

The stage 17 includes a base 19 and an intermediate component 21 which can be displaced by an actuator 18, such as a motor, in the y-direction as indicated by an arrow 23. The object mount can be displaced relative to the intermediate component 21 in the x-direction by operating a further actuator 20 as this is schematically indicated by an arrow 25 in FIG. 2.

The base 19 rests on a bracket 27 which is articulated to a base 29 of the object mount 3 such that the base 19 can be pivoted about the axis 13. The option of pivoting the object 5 about the axis 13 is indicated by an arrow 24 in FIG. 2. The stage 17 may further include an additional intermediate component mounted between the intermediate component 21 and the base 15 to displace the object 5 relative to the base 29 in the z-direction, such that the object mounted on the object mount can be displaced relative to the base of the object mount in three independent directions.

Figure 4:
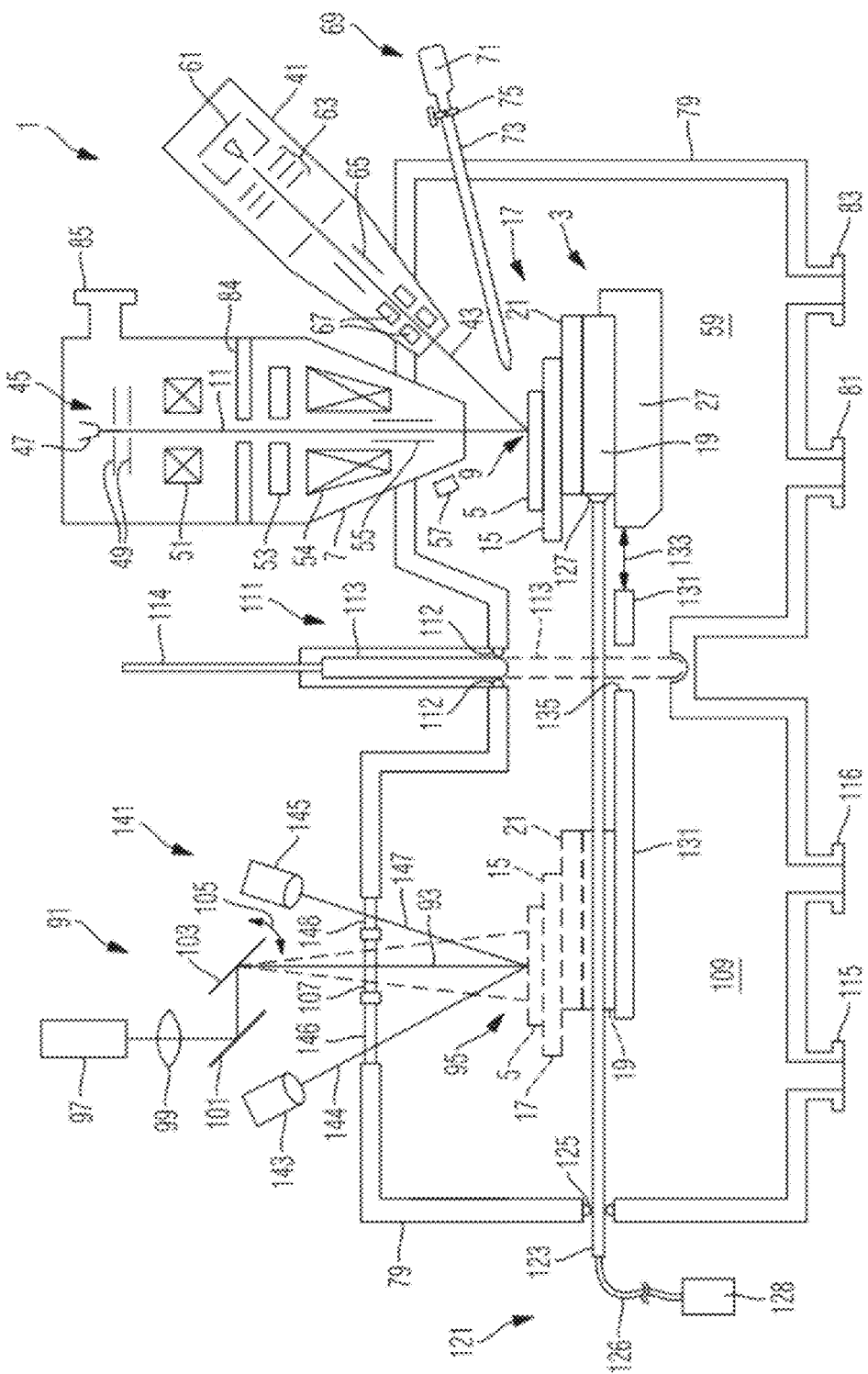
FIG. 4 is a schematic illustration of a processing system.

FIG. 4 is a schematic illustration of the processing system 1, in which the base 29 illustrated with reference to FIG. 1 above is not shown in FIG. 4.

The processing system 1 includes two particle beam columns which include the electron beam column 7 for generating the electron beam 11 directed to the processing location 9, and an ion beam column 41 for generating an ion beam 43 which is also directed to the processing location 9.

The electron beam column 7 includes an electron source 45 having a cathode 47, an electrode system 49, a condenser lens system 51 for generating the beam 11. The electron beam 11 traverses a secondary electron detector 53 and an objective lens 54 for focussing the electron beam 11 at the processing location 9. Beam deflectors 55 are provided for varying the position onto which the electron beam 11 is incident on the object 5. The deflectors 55 can be used to scan the electron beam 11 across a surface of the object 5. Secondary electrons generated during such scanning can be detected with the detector 53 to generate an electron microscopic image of the object 5 in the scanned region at the processing location 9. Additional secondary particle detectors, such as an electron detector 57 or an ion detector can be located adjacent to the electron beam column 7 close to the processing location 9 and within a vacuum chamber 59 to also detect secondary particles.

The ion beam column 41 includes an ion source 61 and electrodes 63 for shaping and accelerating an ion beam 43. Beam deflectors 65 and focussing coils or focussing electrodes 67 are provided to focus the ion beam 43 at the processing location 9 and to scan the ion beam 43 across a region of be object 5.

A gas supply system 69 includes a reservoir 71 for a processing gas which can be selectively supplied via a conduit 73 ending close to the processing location 9 by operating a valve 75. The processing gas can be activated by the ion beam or the electron beam to selectively remove material from the object 5 or to selectively deposit material on the object 5. Such processing can be monitored using the electron microscope 7. A removal of material from the object 5 can be also achieved by directing the ion beam onto the object without supplying of a processing gas.

The vacuum chamber 59 is defined by a vacuum vessel 79 which can be evacuated by a vacuum pump connected to the vessel at a pumping port 81 and which can be vented via a venting port 83. The electron beam column includes a vacuum vessel 84 having a small aperture traversed by the electron beam 11 and separating upper and lower vacuum spaces wherein the electron source is located in the upper vacuum space which is separately pumped via a pumping port 85, such that the electron source 45 can be permanently maintained under high vacuum conditions even when the processing gas is supplied to the processing location 9.

Background information about systems using plural particle beams for processing of an object can be obtained, for example, from US 2005/0184251 A1, U.S. Pat. No. 6,855,938 and U.S. patent application Ser. No. 12/448,229, wherein the full disclosure of these documents is incorporated by reference herein.

The processing system 1 further includes a laser system 91 which is configured to direct a laser beam 93 to a second processing location 95. For this purpose, the laser system 91 includes a laser 97 and collimation optics 99 to shape the laser beam 93. The laser beam is directed via one or more mirrors 101 or via a light guide to a location close to the vacuum chamber 97 where it is incident on a mirror 103 which directs the beam towards the second processing location 95 and which is pivotable as indicated by arrow 105 such that the beam 93 can be scanned across a object disposed at the processing location 95.

The laser beam 93 enters the vacuum space 109 by traversing a window 107. The vacuum space 109 is also defined by the vacuum chamber 79 and can be separated from the vacuum space 59 by closing a door 111. The door 111 includes a shutter plate 113 which is indicated in FIG. 4 by continuous lines in an open position and in broken lines when it is positioned in a closing position. An actuating rod of the door is used to displace the shutter plate 113 from its open position to its closed position. The door 111 can be adapted such that it is, in its closed position, vacuum tight by providing a suitable sealing 112 between the shutter plate 113 and the vacuum vessel 97. It is then possible to maintain different vacuum pressures in the vacuum spaces 59 and 109 if the door is in its closed position. The vacuum space 109 can be separately evacuated via a vacuum port 115 and vented via a venting port 116.

The object 5 can be moved back and forth between the processing location 9 and the processing location 95 by operating the transport system 121. The transport system 121 includes a rod 123 traversing a vacuum seal 125 to extend into the vacuum space 109. The vacuum seal 125 is located at a distance from the processing location 95 which is smaller than a distance between the vacuum seal 125 and the processing location 9. A connector 127 is provided at an end of the rod 123 wherein the connector 127 is configured to be mechanically connected to the base 19 of the stage 17. The connector can be further configured to provide an electrical connection to the stage to control the actuators of the stage in order to displace the object 5 relative to the base of the stage in the at least two or three independent directions. Electrical signals for controlling the actuators con me supplied via wires 126 extending from a controller 128 located outside of the vacuum vessel 79 through an interior of the rod 123 to the connector 127. Sensors, such as one ore more position sensors, can be provided on the stage 17 to measure a current position of the object mount 15 relative to the base 19 of the stage, such that the controller 128 can perform the control of the actuators based on the signals provided by the sensors supplied to the controller via the connector 127 and wires 126 extending through the rod 123.

In the situation shown in FIG. 4, the stage 17 is located such that the object 5 is located at the processing location 9 such that it can be inspected or modified by the electron beam 11 or the ion beam 43. The stage 17 is shown in broken lines in FIG. 4 in a position such that the object 5 is located at the processing location 95 for processing by the laser beam 93. The transport system 21 can move the stage 17, together with the object 5 mounted thereon, back and forth between these two positions. For this purpose, the transport system 121 includes a rail or supporting bar 131 to support the stage 17 against gravity during its transport movement between the processing locations. When the stage is positioned at the processing location 9, the stage is carried by the bracket 27 of the object mount 3 as illustrated above. As shown in FIG. 4, a space 133 is provided between the support bar 131 to allow tilting of the bracket 27 about axis 13 without interference with the support bar 131 after the bar 123 is released from the connector 127 and sufficiently retracted. It is however possible to pull the base 19 of the stage 17 across the distance 133 onto the supporting bar 131. The supporting bar 131 further includes a further space 135 which is traversed by the shutter plate 113 when the door 111 is in its closed position. The door 111 can be closed when the transport system 123 has pulled the stage 17 to the position at the processing location 95, or if the stage is pushed to the position at the processing location 9 and the rod 123 is released from the connector 127 and completely drawn back into the vacuum space 109.

The object 5 is processed with the laser beam 93 at the processing location 95, wherein particles or contaminations evaporating from or released from the object will deteriorate the vacuum conditions in vacuum space 109. It is possible to close the door 11 to separate the vacuum space 59 from the vacuum space 109 to prevent a deterioration of the vacuum in the vacuum space 59. It is in particular possible to prevent contamination of the vacuum space 59 and contamination of components of the particle beam columns 7 and 41.

Processing of the object 5 with the laser beam 93 is monitored using an end point detector 141 which may include, for example, a light source 143 for generating a measuring light beam 144 and a light detector 45. The measuring light beam 144 is directed towards the processing location 95 and enters the vacuum space 109 by traversing the window 146. The light detector 145 receives emerging light 147 originating from processing location 95 through a window 148. The light received by the detector 145 can be analysed to determine a processing condition of the object 5, and the processing of the object 5 by the laser beam 93 can be terminated based on such determination. After the processing by the laser beam 43 is terminated, the door 111 is opened and the transport system 121 moves the object 5 together with the stage to the processing location 9. A further processing of the object 5 can be performed at the processing location 9 by operating the ion beam 43 or electron beam 11, and the object 5 can also be imaged by the electron microscope 7.

A positioning of the stage 17 on the bracket 27 can be performed with a high accuracy. For example, an end stop 22 can be used to precisely position the stage on the bracket 27 wherein the transport system 121 abuts the base of the stage 17 against the end stop 22 before releasing the connector 127.

It is also possible to precisely position the stage on the bracket 17 by using micro switches or proximity sensors and by operating the transport system 121 until such sensors provide a desired measuring signal.

Figure 3:
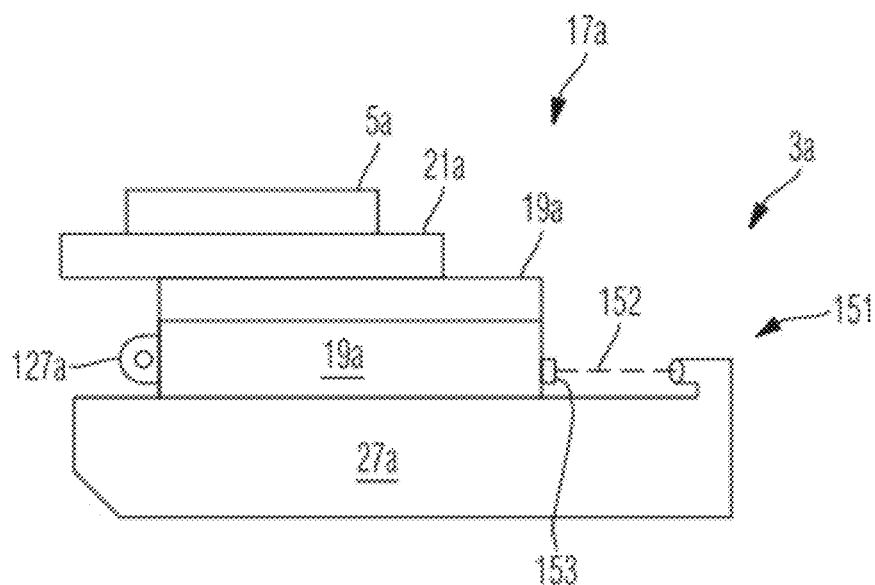
FIG. 3 is a schematic illustration corresponding to FIG. 2 of a stage.

FIG. 3 shows an exemplary embodiment in which an optical distance measuring system 151 is used for positioning a stage 17a relative to a support 27a. The optical distance measuring system 151 emits a light beam 152 reflected from a mirror 153 mounted on a base 19a of the stage 17a. The light reflected from the mirror is analysed for determining a distance between the base 19a and the measuring system 151. The transport system 121 is operated until the measured distance equals a desired distance to a sufficient accuracy.

Figure 5:
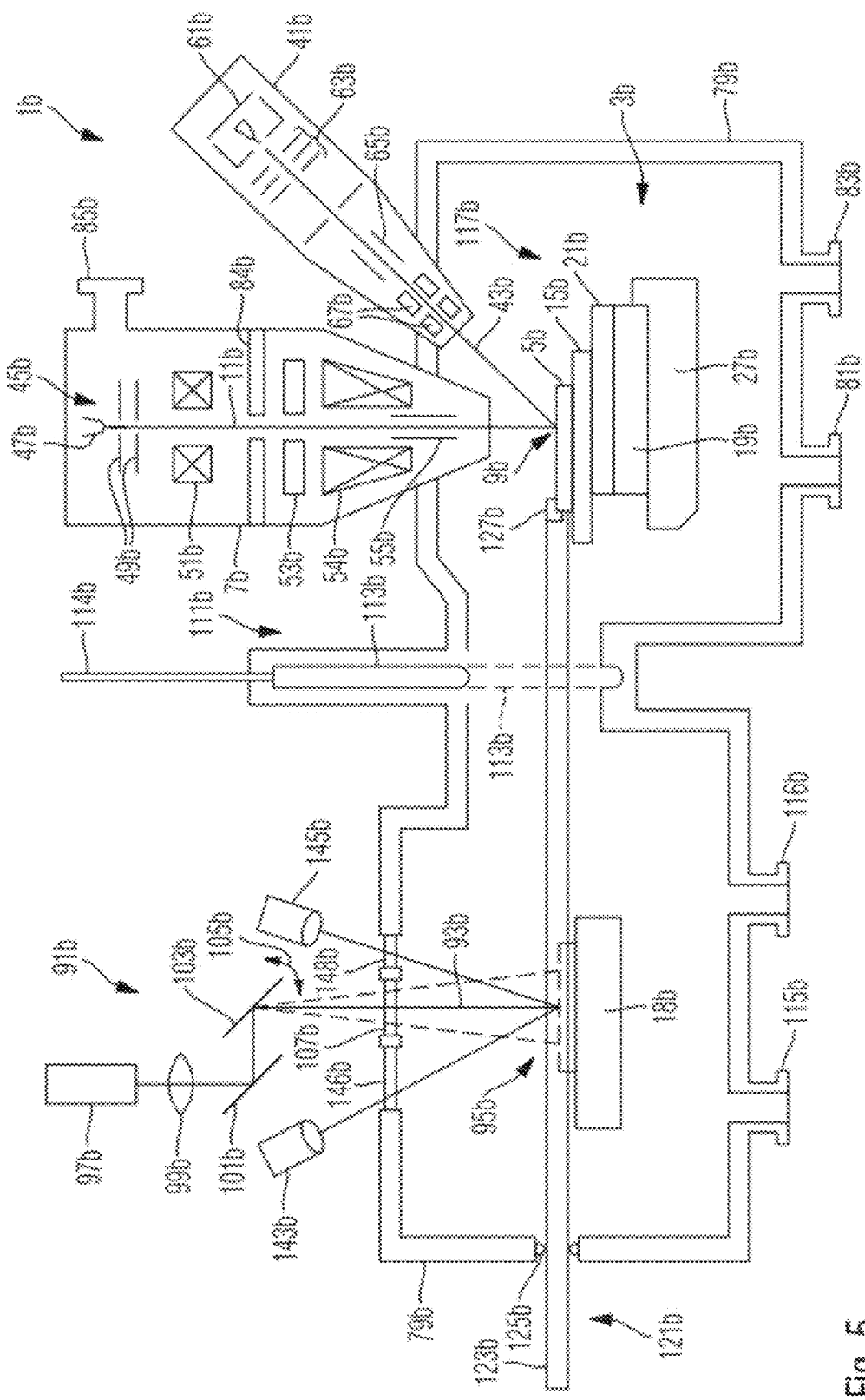
FIG. 5 is a schematic illustration of a processing system.

FIG. 5 shows a further embodiment of a processing system 1b which has a configuration similar to the configuration of the processing system illustrated with reference to FIG. 4 above. The processing system 1b differs from the processing system illustrated above in that a transport system 121 for displacing an object 5b back and forth between a processing location 9b for processing by particle beams 11b and 43b, and a processing location 95b for processing by a laser beam 93b. The processing system includes a rod 123b and a gripper 127b attached to an end of the rod 123b for gripping the object 5b. The object is moved between the processing locations 9b and 95b without moving a stage 17b. The stage 17b remains at its position relative to the processing location 9b and is used to correctly position and orient the object 5b relative to the particle beams 11b and 43b.

A separate stage 18b is provided at the processing location 95b. The gripper 127b can place the object 5b on the stage 18b. The stage 18b may have a configuration which is less complicated than a configuration of the stage 17b. For example, it might be unnecessary to tilt the object about an axis or it may be unnecessary to move the object in three independent directions since the laser beam 93b can be scanned by a pivotable mirror 103b across a region of the object 5b which is larger than a region across the electron beam 11b or the ion beam 43b can be scanned. It may be also unnecessary to provide positional movements in a z-direction, since the collimating optic 99b can be moved in z-direction for changing the focus of the laser beam in z-direction.

Figure 6:
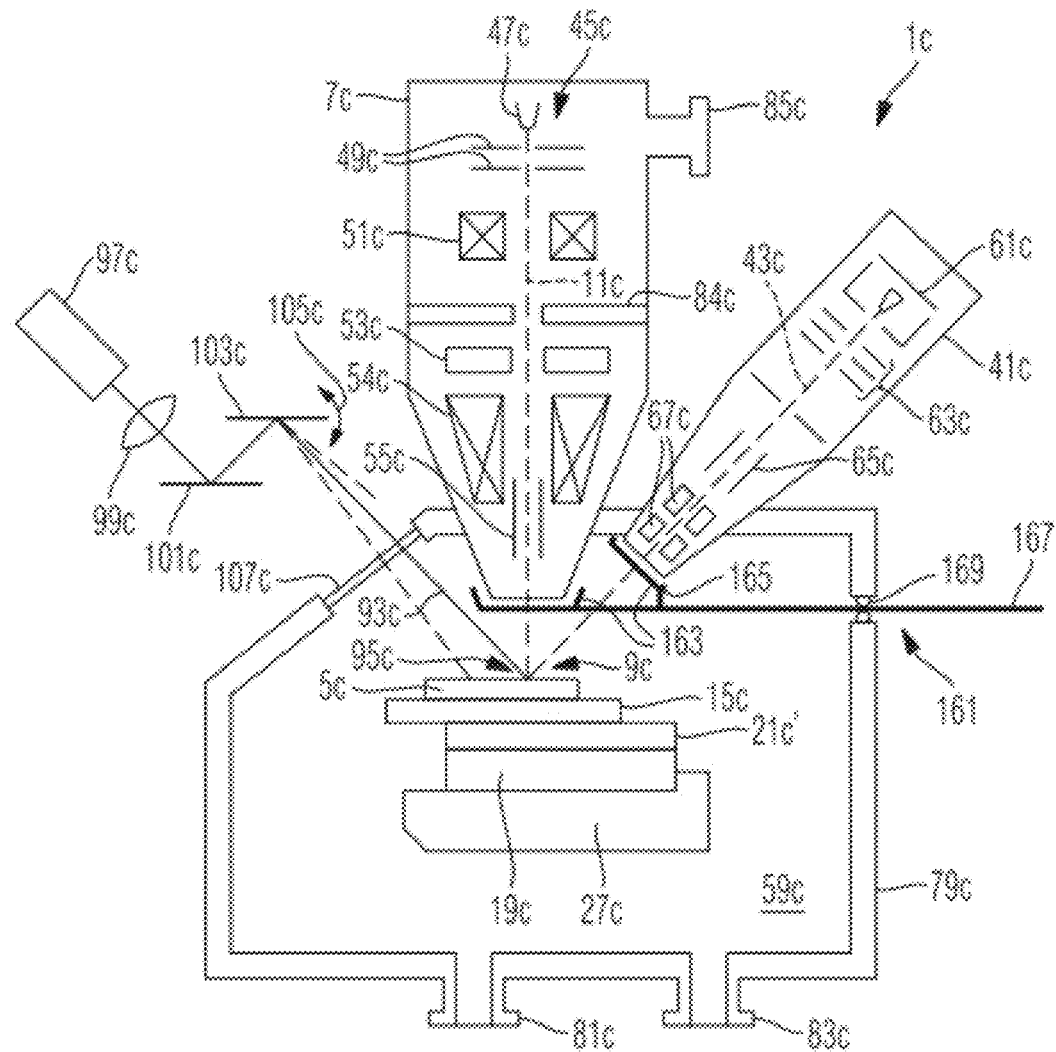
FIG. 6 is a schematic illustration of a processing system.

FIG. 6 is a schematic illustration of a further embodiment of a processing system 1c having a configuration similar to a configuration of the processing systems illustrated with reference to FIGS. 4 and 5 above. The processing system 1c differs from the processing systems illustrated above in that a processing location 9c for processing an object 5c using a particle beam substantially coincides with a processing location 95c for processing the object 5c using a laser beam 93c. The processing locations 9c and 95c are located in a common vacuum space 59c. The processing system 1c does not include a transport system for moving the object between different processing locations. However, the processing system 1c includes a protection system 161 including a cup-shaped protector 163 partially enclosing components of a particle beam column 7c when the protection system is in a protecting position as shown in FIG. 6. The protection system 161 further includes a cup-shaped protector 165 partially enclosing components of an ion beam column 41c when the protection system is in the protection position. The protectors 163 and 165 protect components of the electron beam column 7c and the ion beam column 41c during processing of the object 5c with the laser beam 93c. After termination of the processing by the laser beam 93c, the protectors 163 and 165 which are mounted on a rod 167 can be retracted into a retracted position in which they do not interfere with a processing of the object 5c with the electron beam 11c or the ion beam 43c. The rod 167 may traverse a vacuum vessel 79b defining the vacuum space 59b by traversing a suitable sealing 169. The rod 167 can be operated by an actuator, such as a motor, or by hand, for displacing the protectors 163, 165 between the protecting position and the retracted position.

Protectors and those illustrated above can also be used to protect particle detectors disposed in the vacuum space 59b close to the object 5b while performing the processing with the laser beam.

In the embodiments illustrated above, an electron beam column and an ion beam column are provided. It is, however, also possible to provide only one particle beam column, such as the electron beam column or the ion beam column, wherein the single particle beam column is integrated in a processing system together with a laser system for processing the object.

In the embodiments illustrated with reference to FIGS. 4 and 5 above, the processing location for processing using at least one particle beam is located at a relatively large distance from a processing location for processing by a laser beam. Moreover, a door is provided for separating the corresponding vacuum spaces from each other. It is, however, also possible to merely provide a protector between the processing location for laser processing and the processing position for particle beam processing, wherein the protector intercepts particles released during the laser beam processing. The protector can be formed as a plate which is attached to a rod or other suitable tool for displacing the protector. In some of these embodiments it may be unnecessary to provide the protector with a function of a vacuum tight shutter such that the two processing locations can be located in a same vacuum space.

However, it is also possible to separate the corresponding vacuum spaces by a vacuum lock including more than one shutter such that the object is placed in a space between two closed shutters when it is transferred from one processing position to the other.

The above illustrated embodiments, the laser processing system generates a laser beam which traverses a window in a vacuum vessel to enter the vacuum space, wherein a raster device, such as a pivotable mirror (103) is located outside of the vacuum space. It is, however, also possible to direct the laser beam into the interior of the vacuum space by another mechanism, such as a light guide, and it is also possible to have the collimation optics located within the vacuum space.

In the above illustrated embodiments, an end point detector for determining a termination of the laser processing includes a light source for generating a measuring beam and a detector. According to other embodiments, it is possible to determinate the processing by the laser beam based on other principles. For example, light generated by the processing laser beam and reflected from the object can be detected to monitor the laser processing. It is further possible to detect a light generated by a laser induced plasma generated during the operation of the processing laser. It is further possible to provide a plasma source for generating a plasma close to the process object, wherein material removed from the object experiences charge carrier recombinations which generate characteristic light which is indicated of the type of material currently processed. A determination for terminating the laser processing can be based on detection of such characteristic light.

What is claimed is:

1. A system, comprising:
 a particle beam column configured to generate a particle beam directed to a first processing location;
 a laser system configured to generate a laser beam directed to a second processing location located a distance from the first processing location;
 a stage comprising a base and an object mount to mount an object, the stage being configured to displace the object mount relative to the base in at least two independent directions;
 a first stage mount configured to hold the stage in a first position such that, when the stage is in the first position, the object is located in a region of the first processing location;
 a second stage mount configured to mount the stage in a second position such that, when the stage is in the second position, the object is located in a region of the second processing location; and
 a transport device configured to transport the stage between the first and second positions.

2. The system of claim 1, wherein at least one of the first and second stage mounts comprises a position sensor to detect a position of the stage mount.

3. The system according to claim 2, wherein the particle beam column is an electron beam column.

4. The system according to claim 2, wherein the particle beam column is an ion beam column.

5. The system according to claim 1, further comprising a vacuum chamber, wherein the first processing location, the second processing location, and a transport path of the stage between the first and second positions are located within the vacuum chamber.

6. The system according to claim 5, wherein the vacuum chamber includes a door separating a first vacuum space in which the first processing location is located from a second vacuum space in which the second processing location is located.

7. The system according to claim 6, wherein the transport device comprises a rod and a connector attached to the rod, the connector is configured to be attached to the stage, the transport device is configured to move the rod between first and second rod positions, the connector is located closer to the first processing location when the rod is in the first rod position than when rod is in the second rod position, and the rod extends through an opening of the door when the rod is in the first rod position.

8. The system of claim 7, wherein at least one of the first and second stage mounts comprises a position sensor to detect a position of the stage mount.

9. The system according to claim 7, wherein the particle beam column is an electron beam column.

10. The system according to claim 7, wherein the particle beam column is an ion beam column.

11. The system of claim 6, wherein at least one of the first and second stage mounts comprises a position sensor to detect a position of the stage mount.

12. The system according to claim 6, wherein the particle beam column is an electron beam column.

13. The system according to claim 6, wherein the particle beam column is an ion beam column.

14. The system of claim 5, wherein at least one of the first and second stage mounts comprises a position sensor to detect a position of the stage mount.

15. The system according to claim 5, wherein the particle beam column is an electron beam column.

16. The system according to claim 5, wherein the particle beam column is an ion beam column.

17. The system according to claim 1, wherein the particle beam column is an electron beam column.

18. The system according to claim 1, wherein the particle beam column is an ion beam column.

19. A method comprising:
 using the system of claim 1 to modify and/or inspect an object.

20. The method of claim 19, wherein the particle beam column is an ion beam column or an electron beam column.

* * * * *

UNITED STATES PATENT AND TRADEMARK OFFICE
CERTIFICATE OF CORRECTION

PATENT NO. : 8,350,227 B2
APPLICATION NO. : 13/336155
DATED : January 8, 2013
INVENTOR(S) : Holger Doemer It is certified that error appears in the above-identified patent and that said Letters Patent is hereby corrected as shown below:

Column 2,
Line 9, after "to" delete "the"

Column 5,
Line 6, after "of" delete "be"

Column 6,
Line 8, delete "con me" and insert --can be--

Column 6,
Line 11, delete "ore" and insert --or--

Signed and Sealed this
Twelfth Day of March, 2013

Teresa Stanek Rea
*Acting Director of the United States Patent and Trademark Office*